Nov. 12, 1963 J. L. BOYER ETAL 3,110,080

RECTIFIER FABRICATION

Filed Jan. 20, 1958

WITNESSES:

Bernard R. Gieguay

Myron E. Click

INVENTORS

John L. Boyer and

Milo W. Slye.

BY F. E. Browder

ATTORNEY 3,110,080

RECTIFIER FABRICATION

John L. Boyer, Forest Hills, and Milo W. Slye, North Irwin, Pa., assignors to Westinghouse Electric Corporation, East Pittsburgh, Pa., a corporation of Pennsylvania Filed Jan. 20, 1958, Ser. No. 710,110
7 Claims. (Cl. 29—25.3)

This invention relates generally to the fabrication of rectifiers and particularly to the fabrication of semiconductor diode rectifiers.

In the past, the manufacture of semiconductor diode rectifiers has been expensive because of the large number of complicated manufacturing steps required. Large germanium and silicon rectifiers are produced by soldering top and bottom layers to the semiconductor materials. The layers had about the same coefficient of expansion as the semiconductor material and were used to provide stable surfaces to which main electrodes were attached. It was then necessary in a second manufacturing step to assemble the rectifier cell in a hermetically tight container, which is usually expensive since several operations are usually involved.

It is an object of this invention to provide an improved method of fabricating semiconductor rectifiers.

It is another object of this invention to provide an improved method of fabricating semiconductor rectifiers in one major manufacturing step by using materials having the same coefficient of thermal expansion as the semiconductor material for the current electrodes and the envelope, and by using alloying and soldering metals which have approximately the same melting temperature.

Further objects of this invention will become apparent when the following description is taken in conjunction with the accompanying drawings.

Figures 1, 2, 3:
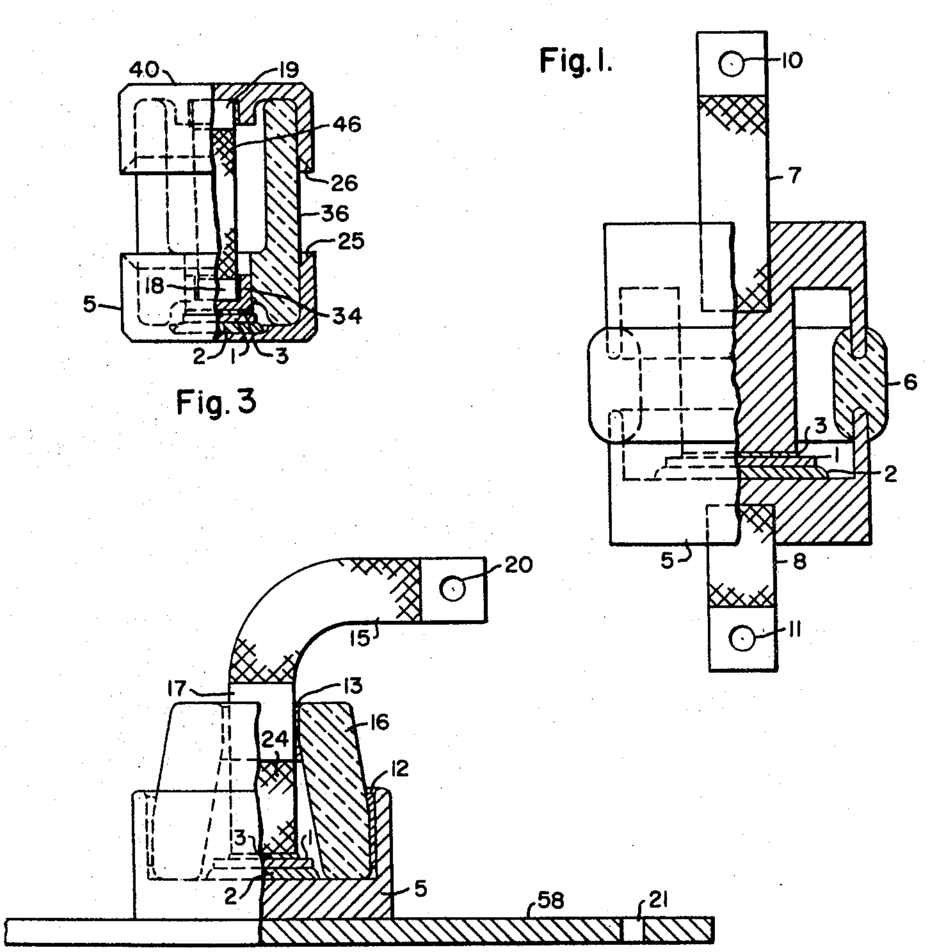
FIGURE 1 shows a partial cross-sectional diagram of the diode fabricated by the method embodying the teachings of this invention.
FIG. 2 is a partial cross-section of a second embodiment of a diode rectifier fabricated by the method of this invention.
FIG. 3 is a partial cross-sectional diagram of a third embodiment of a semiconductor diode rectifier fabricated by the method of this invention.

The alloyed junction semiconductor diode usually comprises a semiconductor crystal wafer composed, for example, of germanium or silicon; the wafer having an alloying impurity fused, soldered or alloyed into one of its faces to form P-N junctions within the crystal. For example, an N-type germanium wafer may be used with a P-type alloying metal impurity fused to its face. The P-type impurity is usually selected from the column 3 of the periodic table, and at the present time indium is preferred. This is because indium will alloy with germanium at relatively low temperatures, and upon solidification of the indium no appreciable stresses are set up in the crystal.

Referring to FIG. 1, there is shown a semiconductor rectifier made according to this invention. A semiconductor wafer 1 forms the rectifier layer at its top surface. The rectifier junction is made by changing the impurities from N-type to P-type by means of alloy material used at either layer 2 or layer 3. The alloy material is also used to solder one side of the semiconductor wafer 1 to a main electrode 4 or 5. An ohmic type of solder is used to make the connection to the electrodes 4 or 5 on the other side.

The main electrode 5 is shown as a cylindrically shaped or cup-shaped member having one end closed with room in the cylinder in which to insert the semiconductor wafer 1. A flexible lead 8 may be connected to the electrode 5. The flexible lead 8 may also have aperture means 11 for connecting into an electrical circuit. The electrode 4 is shown in FIG. 1 as a cylindrically shaped or cup-shaped member having one end closed. The electrode 4 has an outwardly extending member which is centrally located within the open end of the cylindrical member and is of such a length to hold the semiconductor wafer 1 and the solder layers 2 and 3 firmly and make good electrical connection at the end of the process to be described hereinafter. The electrode 4 may have a flexible lead 7 attached with aperture means 10 for attaching said flexible lead into an electrical circuit. An annular insulating member 6 provides insulation between the electrodes 4 and 5 and also provides for hermetically sealing the diode illustrated in FIG. 1.

In many of the germanium rectifiers that have been made, indium has been used for the solder 3 and pure tin has been used for the solder 2. In many of the silicon rectifiers that have been made according to this invention, aluminum has been used for the impurity solder 3 and an alloy of silver with 5% germanium or pure silver has been used for the ohmic solder 2.

An important part of the invention as illustrated in FIG. 1 is the use of a glass or insulating material 6 which has about the same melting point as the forming temperature of the P-N junction between the semiconductor wafer 1 and the layer 2 or the layer 3. This allows the melting of the solders 2 and 3, the forming of the glass seal with the electrodes 4 and 5, which may be molybdenum, and the making of the P-N junction in one furnace operation.

The compactness of the diode rectifier illustrated in FIG. 1 with a minimum number of layers is made possible by using materials for the main rectifier electrodes 4 and 5 and the envelope 6 which have about the same thermal expansion as the semiconductor wafer material 1. Since almost all of the materials used in this method of manufacture for fabricating rectifier seals have about the same coefficient of expansion, the rectifier can be manufactured as a unit and can be operated at high temperatures without mechanical strain.

Referring to FIG. 2 there is illustrated a second embodiment of a semiconductor diode which may be fabricated by the method of this invention. In the cross-sectional view the same type of electrode 5 is used as in the diode illustrated in FIG. 1. Similarly, the semiconductor wafer 1 and the solder layers 2 and 3 are the same as in FIG. 1. However, in FIG. 2 the porcelain insulating member 16 is formed to fit within the electrode 5 and to have the electrode 24 inserted in an opening in the upper portion of the truncated-conical shaped porcelain member 16. The electrode 24 is of the same type of material as is shown in FIG. 1 and may be attached to a sealing member 17 by a flexible lead 14. The sealing member 17 is adaptive to be soldered to the porcelain insulating member 16 by the solder layer 13. The sealing member 17 may be connected by a flexible lead 15 to a means 20 for connecting the rectifier unit of FIG. 2 into an electrical circuit. The electrode 5 may be attached to a base plate 58 which may or may not have cooling fins but which does have an aperture or means 21 for connecting said base plate into an electrical circuit.

Again the same principles are utilized in fabricating the rectifier unit shown in FIG. 2 as in FIG. 1. The solder layers 13, between the electrode holding sealing member 17 and the porcelain insulator 16, and the solder layer 12, between the porcelain insulator 16 and the electrode 5, are designed to melt below the fusion temperature as the solder layers 2 and 3, thus permitting again only one furnace operation. The base or cooling fin 58 may be soldered to the electrode 5 in the same furnace operation or in a later operation.

Referring to FIG. 3, there is shown a third embodiment of a rectifier diode fabricated by the teachings of this invention. The electrode 5, the semiconductor wafer 1 and the solder layers 2 and 3 remain the same as in FIGS. 1 and 2. However, the electrode 34 is now connected to a member 40, which doubles as an external electrode and encapsulating member, by a flexible lead 46. The flexible lead may be attached to the electrode 34 and the member 40 by any one of several well known means such as fusing, soldering, or alloying.

In FIG. 3 the porcelain insulating member 36 is made in a cylindrical form which will fit on the inside of the aforedescribed electrode 5. Since the porcelain insulator 36 is a cylinder, the member 40 may be formed in the same shape as the electrode 5, the only difference being the means for attaching the terminal portion 19 of the flexible lead 46 to the inside of the member 40. The terminal portion 19 may be attached by soldering, alloying, fusing or other similar method. The electrode 5 and the member 40 may be best joined or soldered to the porcelain insulating member 36 by having chamfers 25 and 26 of, for example 45°, formed sloping toward the inside portion of the said members. If the insulating member 36 is to be of glass or some similar material which will melt and combine with the material from which the electrode 5 and the member 40 is made, then, of course, no soldering will be required. The electrodes described herein may be made of a material such as molybdenum.

In the furnace operation for each of the three embodiments shown, it is to be understood that an operation vacuum may be first used and then an inert gas such as helium or argon may be admitted. The inert gas, of course, will fill the rectifier envelope before the heating, sealing and soldering operation takes place.

This method of fabrication for semiconductor diode rectifiers gives new advantages in that the number of layers can be kept to a minimum and all major parts can be assembled in one furnace operation. This is conducive to a low manufacturing cost since it allows mass production of such diode rectifiers in one furnace with a minimum of manpower.

In conclusion, it is pointed out that while the illustrated examples constitute practical embodiments of our invention, we do not limit ourselves to the exact details shown and described, since modification of the same may be varied without departing from the spirit and scope of this invention.

We claim as our invention:

1. The method of fabricating a diode element, comprising: forming a first electrode member; providing a member of semiconductor material upon said first electrode member; providing a first solder material between said first electrode member and said semiconductor member; positioning a second electrode member on top of said semiconductor member; providing a second solder material between said second electrode member and said semiconductor material; one of said two solders comprising an impurity material having the opposite type of semiconductive properties as said semiconductor member; positioning an encapsulating insulating member having means for effecting a hermetic seal between said first and second electrodes; the assembly comprising said first and second electrodes, said insulating member, said first and second solders, and said semiconductor member having substantially the same coefficient of thermal expansion; and heating said assembly in a single heating operation to a temperature sufficient to form a PN junction in said semiconductor material and to solder said first and second electrodes to said semiconductor member and to effect a hermetic seal between said insulating member and said first and second electrodes.

2. The method of fabricating a diode element, comprising: forming a first electrode member; providing a member of germanium semiconductor material upon said first electrode member; providing a first solder material between said first electrode member and said semiconductor member; positioning a second electrode member on said semiconductor member; providing a second solder material between said second electrode member and said semiconductor material; one of said two solders comprising an impurity material of indium having the opposite type of semiconductive properties as said semiconductor member; the other of said two solders comprising a tin solder for an ohmic connection; positioning an encapsulating insulating member having means for effecting a hermetic seal between said first and second electrodes; the assembly comprising said first and second electrodes, said insulating member, said first and second solders, and said semiconductor member having substantially the same coefficient of thermal expansion; and heating said assembly in a single heating operation to a temperature sufficient to form a PN junction in said germanium material and to solder said first and second electrodes to said semiconductor member and to effect a hermetic seal between said insulating member and said first and second electrodes.

3. The method of fabricating a diode element, comprising: forming a first electrode member; providing a member of silicon semiconductor material upon said first electrode member; providing a first solder material between said first electrode member and said semiconductor member; positioning a second electrode member on top of said semi-conductor member; providing a second solder material between said second electrode member and said semiconductor material; one of said two solders comprising an impurity material of aluminum having the opposite type of semi-conductive properties as said semiconductor member; the other of said two solders comprising a pure silver for an ohmic connection; positioning an encapsulating insulating member having means for effecting a hermetic seal between said first and second electrodes; the assembly comprising said first and second electrodes, said insulating member, said first and second solders, and said semiconductor member having substantially the same coefficient of thermal expansion; and heating said assembly in a single heating operation to a temperature sufficient to form a PN junction in said semiconductor member and to solder said first and second electrodes to said semiconductor member and to effect a hermetic seal between said insulating member and said first and second electrodes.

4. The method of fabricating a diode element, comprising: forming a first electrode member; providing a member of silicon semiconductor material upon said first electrode member; providing a first solder material between said first electrode member and said semiconductor member; positioning a second electrode member on top of said semi-conductor member; providing a second solder material between said second electrode member and said semiconductor material; one of said two solders comprising an impurity material of aluminum having the opposite type of semiconductive properties as said semiconductor member; the other of said two solders comprising an alloy of silver with 5% germanium for an ohmic connection; positioning an encapsulating insulating member having means for effecting a hermetic seal between said first and second electrodes; the assembly comprising said first and second electrodes, said insulating member, said first and second solders, and said semiconductor member having substantially the same coefficient of thermal expansion; and heating said assembly in a single heating operation to a temperature sufficient to form a PN junction is said semiconductor member and solder said first and second electrodes to said semiconductor member and to effect a hermetic seal between said insulating member and said first and second electrodes.

5. The method of fabricating a diode element, comprising: forming a first electrode member; providing a germanium semiconductor member upon said first electrode member; providing a first solder material between said first electrode member and said semiconductor member; positioning a second electrode member on top of said semi-conductor member; providing a second solder material between said second electrode member and said semiconductor member; one of said two solders comprising an impurity material of indium having the opposite type of semiconductive properties as said semiconductor member; the other of said solders comprising a tin for an ohmic connection; positioning an encapsulating insulating member having means for effecting a hermetic seal between said first and second electrodes; said first and second electrodes being made of molybdenum; the assembly comprising said first and second electrodes, said insulating member, said first and second solders, and said semiconductor member having substantially the same coefficient of thermal expansion; and heating said assembly in a single heating operation to a temperature sufficient to form a PN junction in said semiconductor member and to solder said first and second electrodes to said semiconductor member and to effect a hermetic seal between said insulating member and said first and second electrodes.

6. The method of fabricating a diode element, comprising: forming a first electrode member; providing a member of silicon semiconductor material upon said first electrode member; providing a first solder material between said first electrode member and said semiconductor member; positioning a second electrode member on top of said semi-conductor member; providing a second solder material between said second electrode member and said semiconductor material; one of said two solders comprising an impurity material of aluminum having the opposite type of semi-conductive properties as said semiconductor member; the other of said two solders comprising a pure silver for an ohmic connection; positioning an encapsulating insulating member having means for effecting a hermetic seal between said first and second electrodes; said first and second electrodes being made of molybdenum; the assembly comprising said first and second electrodes, said insulating member, said first and second solders, and said semiconductor member having substantially the same coefficient of thermal expansion; and heating said assembly in a single heating operation to a temperature sufficient to form a PN junction in said semiconductor material and to solder said first and second electrodes to said semiconductor member and to effect a hermetic seal between said insulating member and said first and second electrodes.

7. The method of fabricating a diode element, comprising: providing a first electrode member; providing a member of silicon semiconductor material upon said first electrode member; providing a first solder material between said first electrode member and said semiconductor member; positioning a second electrode member on top of said semiconductor member; providing a second solder material between said second electrode member and said semiconductor material; one of said two solders comprising an impurity material of aluminum having the opposite type of semiconductive properties as said semiconductor member; the other of said two solders comprising an alloy of silver with 5% germanium for an ohmic connection; positioning an encapsulating insulating member having means for effecting a hermetic seal between said first and second electrodes; said first and second electrodes being made of molybdenum; the assembly comprising said first and second electrodes, said insulating member, said first and second solders, and said semiconductor member having substantially the same coefficient of thermal expansion; and heating said assembly in a single heating operation to a temperature sufficient to form a PN junction in said semiconductor material and to solder said first and second electrodes to said semiconductor member and to effect a hermetic seal between said insulating member and said first and second electrodes.

References Cited in the file of this patent

UNITED STATES PATENTS

| | | |
|---|---|---|
| 2,763,822 | Frola et al. | Sept. 18, 1956 |
| 2,863,105 | Ross | Dec. 2, 1958 |